(12) United States Patent
Azarian (10) Patent No.: US 8,378,693 B2
(45) Date of Patent: Feb. 19, 2013

(54) VECTOR NETWORK ANALYZER (VNA) ON A CHIP

(75) Inventor: Michel M. Azarian, Austin, TX (US)

(73) Assignee: National Instruments Corporation, Austin, TX (US)

(*) Notice: Subject to any disclaimer, the term of this patent is extended or adjusted under 35 U.S.C. 154(b) by 718 days.

(21) Appl. No.: 12/258,761

(22) Filed: Oct. 27, 2008

(65) Prior Publication Data

US 2010/0102829 A1 Apr. 29, 2010

(51) Int. Cl.
*G01R 27/28* (2006.01)

(52) U.S. Cl. ..... 324/650; 324/637; 324/638; 324/76.19; 324/76.22; 324/76.53; 324/601; 324/605; 702/76; 702/85; 702/117

(58) Field of Classification Search ............ 324/637, 324/76.19, 76.53, 76.22, 601, 605, 650; 702/76, 702/85, 117
See application file for complete search history.

(56) References Cited

U.S. PATENT DOCUMENTS

| | | | |
|---|---|---|---|
| 4,680,538 A | 7/1987 | Dalman et al. | |
| 4,816,767 A * | 3/1989 | Cannon et al. | 324/601 |
| 5,059,915 A | 10/1991 | Grace et al. | |
| 5,089,782 A | 2/1992 | Pike et al. | |
| 5,307,284 A | 4/1994 | Brunfeldt et al. | |
| 5,564,097 A | 10/1996 | Swanke | |
| 5,642,039 A | 6/1997 | Bradley et al. | |
| 6,157,183 A | 12/2000 | Bradley | |
| 6,348,804 B1 | 2/2002 | Evers | |
| 6,421,624 B1 * | 7/2002 | Nakayama et al. | 702/117 |
| 6,480,013 B1 | 11/2002 | Nayler et al. | |
| 6,590,399 B1 | 7/2003 | Karl et al. | |
| 6,650,123 B2 | 11/2003 | Martens | |
| 6,928,373 B2 | 8/2005 | Martens et al. | |
| 7,145,323 B2 | 12/2006 | Van Horn et al. | |
| 7,248,033 B2 | 7/2007 | Anderson et al. | |
| 7,256,585 B1 | 8/2007 | Shoulders | |
| 2006/0025946 A1 * | 2/2006 | Jenkins et al. | 702/76 |
| 2007/0236230 A1 * | 10/2007 | Tanbakuchi et al. | 324/650 |

OTHER PUBLICATIONS

Tom McDermott; "TAPR Vector Network Analyzer Project Update 2004"; Sep. 11, 2004; 24 Pages.
Tom McDermott; "TAPR Vector Network Analyzer Project Update 2005"; Sep. 24, 2005; 14 Pages.
"Make Precise Base-Station Power Measurements"; Microwaves & RF; Nov. 2002; 7 Pages.

(Continued)

*Primary Examiner* — Timothy J Dole
*Assistant Examiner* — Son Le
(74) *Attorney, Agent, or Firm* — Meyertons Hood Kivlin Kowert & Goetzel, P.C.; Jeffrey C. Hood (57) ABSTRACT

A front end of a vector network analyzer (VNA) on an integrated circuit includes a clock generator and two ports. The VNA couples to a device under test (DUT) using the two ports. Each port may include a plurality of receivers and a VSWR bridge, and can be configured as either an input or an output. The clock generator can generate a stimulus signal, an in-phase I clock signal, and a quadrature-phase Q clock signal. The output port provides the stimulus signal to the DUT and measures both reference and reflected power from the DUT, such as by utilizing two receivers by using direct conversion and the I and Q clock signals. The input port measures transmitted power through the DUT using a second VSWR bridge and one of its receivers by using direct conversion along with the I and Q clock signals. The VNA IC can provide S-parameter measurements to a processing unit for further processing and/or analysis to compute the DUT S-parameters.

17 Claims, 5 Drawing Sheets

OTHER PUBLICATIONS

"AD8302-LF-2.7 GHz RF/IF Gain and Phase Detector"; Analog Devices; 2002; 24 Pages.

"Agilent Network Analyzer Basics"; Agilent Technologies; 2004; 94 Pages.

"Build a Vector Network Analyzer"; Electronic Design; 2006; Accessed from Internet at http://electronicdesign.com/Articles/ArticleID/4376/4376.html.

Jan Verspecht; "Large-Signal Network Analysis"; IEEE Microwave Magazine, vol. 6, Issue 4; Dec. 2005; 14 Pages.

Michael Hiebel; "Fundamentals of Vector Network Analysis"; Rohde & Schwarz; Oct. 2007. Accessed from Internet at http://www.books.rohde-schwarz.com/go/rohdeschwarz/s,showModuleObject3,9_q1klWYtB,cxW0_xm1oxa1_xm1dtqZgVG,4Fa0jtW3hxW2nB,8xa0nVX0_JH,nRXYoxF1m_a2uAb1jRW28Rr1uoG-4Zq0qtWY,nB,_tG.xhtml.

Paul Kiciak; "N2PK's Amateur Radio Projects Page"; Nov. 2006. Accessed from Internet at http://n2pk.com/.

Paul Kiciak; "N2PK VNA—How it Works"; Aug. 2007. Accessed from Internet at http://n2pk.com/VNA/VNAarch.html.

"Network Analyzer (Electrical)"; Wikipedia, the Free Encyclopedia. Accessed from Internet at http://en.wikipedia.org/wiki/Network_analyzer_(electrical).

Robert Lacoste; "Vector-SoC, a 1GHz Vectorial Network Analyzer—Abstract"; Jul. 2002; 2 Pages.

Ray Ridley; "Measuring Frequency Response: Tips and Methods"; Switching Power Magazine; Spring 2002; 16 Pages.

Michael Hiebel; "VNA Evolution: A European Perspective"; 2007; 6 Pages.

"TAPR Software Library"; Dec. 2006. Accessed from Internet at http://www.tapr.org/software_library.php?dir=/aprssig.

"TAPR Vector Network Analyzer"; 2004. Accessed from Internet at http://www.tapr.org/kits_vna.html.

Paul Kiciak; "An HF Vector Network Analyzer—Part 1"; 2008; 18 Pages.

\* cited by examiner

VECTOR NETWORK ANALYZER (VNA) ON A CHIP

FIELD OF THE INVENTION

The present invention relates to the field of vector network analyzers, and more particularly to an integrated circuit with VNA functionality.

DESCRIPTION OF THE RELATED ART

A vector network analyzer (VNA) is a useful instrument for many applications where electrical and/or microwave measurements, such as transmission and reflection properties, are needed. VNA's are usually used where the electrical signals have a high frequency, such as from 10 kHz to 100 GHz. Since a VNA can be used to measure complex impedances of circuits at high frequencies, VNAs can be found in many electronic and radio frequency (RF) laboratories, as well as in chip/microwave device or system manufacturing facilities.

A VNA can apply a stimulus sine wave to a device under test (DUT) and perform a series of measurements and calculations. A two-port VNA can measure both reflected signals from the DUT and transmitted signals through the DUT. Additionally, the VNA can calculate S-parameters and other related parameters for that DUT. The VNA can repeat this procedure using different frequencies and/or power levels to measure the desired characteristics of the DUT.

A traditional VNA is a complex device which usually occupies a large volume and is expensive. A traditional VNA typically uses multiple heterodyne receivers for operating on a frequency of an incoming signal, mixing it with a locally generated signal and converting it to an intermediate frequency (IF) in order to facilitate amplification, analog-to-digital signal conversion, and analysis. The heterodyne receivers may require several frequency synthesizers to facilitate frequency locking among stages. However, the use of heterodyne receivers also introduces unwanted spurs (i.e., spectral signals), which are attempted to be removed by filters. A traditional VNA usually generates a stimulus sine wave through frequency multiplication or division, which requires filtering to remove any resulting harmonics and sub-harmonics. Because of all these complicating factors (e.g., complexity, size, and cost) of a traditional VNA, only a few companies venture to build VNA's, which usually makes them large and expensive.

SUMMARY OF THE INVENTION

Various embodiments of a vector network analyzer (VNA) on an integrated circuit (IC) are presented below. In some embodiments, the VNA IC may be an ASIC that may replace many of the components in a VNA system. Using this VNA IC, a full-featured VNA can be built at a fraction of the cost of a traditional VNA while occupying less physical space.

The VNA IC may include a clock generator and two ports. The clock generator may comprise a tone generator, a signal conditioning unit, and a quadrature generator (e.g., a polyphase filter bank). The tone generator may be able to generate a single clock signal, which may be transmitted to the signal conditioning unit. The signal conditioning unit may generate a filtered first clock signal and the stimulus signal, where the filtered clock signal may be transmitted to the quadrature generator. The quadrature generator may generate the I clock signal and the Q clock signal in response to receiving the filtered single clock signal. These I and Q clock signals may be used with receiver mixers to facilitate direct conversion.

Each of the two ports in the VNA IC may be coupled to a device under test (DUT) and may include a plurality of receivers and a VSWR bridge. Each of the two ports can be configured as an input or an output, for example the first port can act as an input with the second port as an output, and vice versa. The output port can provide the stimulus signal to the DUT and measure reference power using one of its receivers and reflected power using the other receiver, where its VSWR bridge may function as a directional device (and distinguish between the applied and reflected powers).

The input port can measure transmitted power through the DUT using a second VSWR bridge as a pass-through device. The receivers on both ports can receive the measurements and generate proportional DC signals by using direct conversion, which may use the I and Q clock signals from the clock generation unit. The VNA IC can provide the DC measurements to a processing unit after being low pass filtered and/or digitized (e.g., using analog-to-digital converters) for S-parameter calculations and/or or further analysis.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
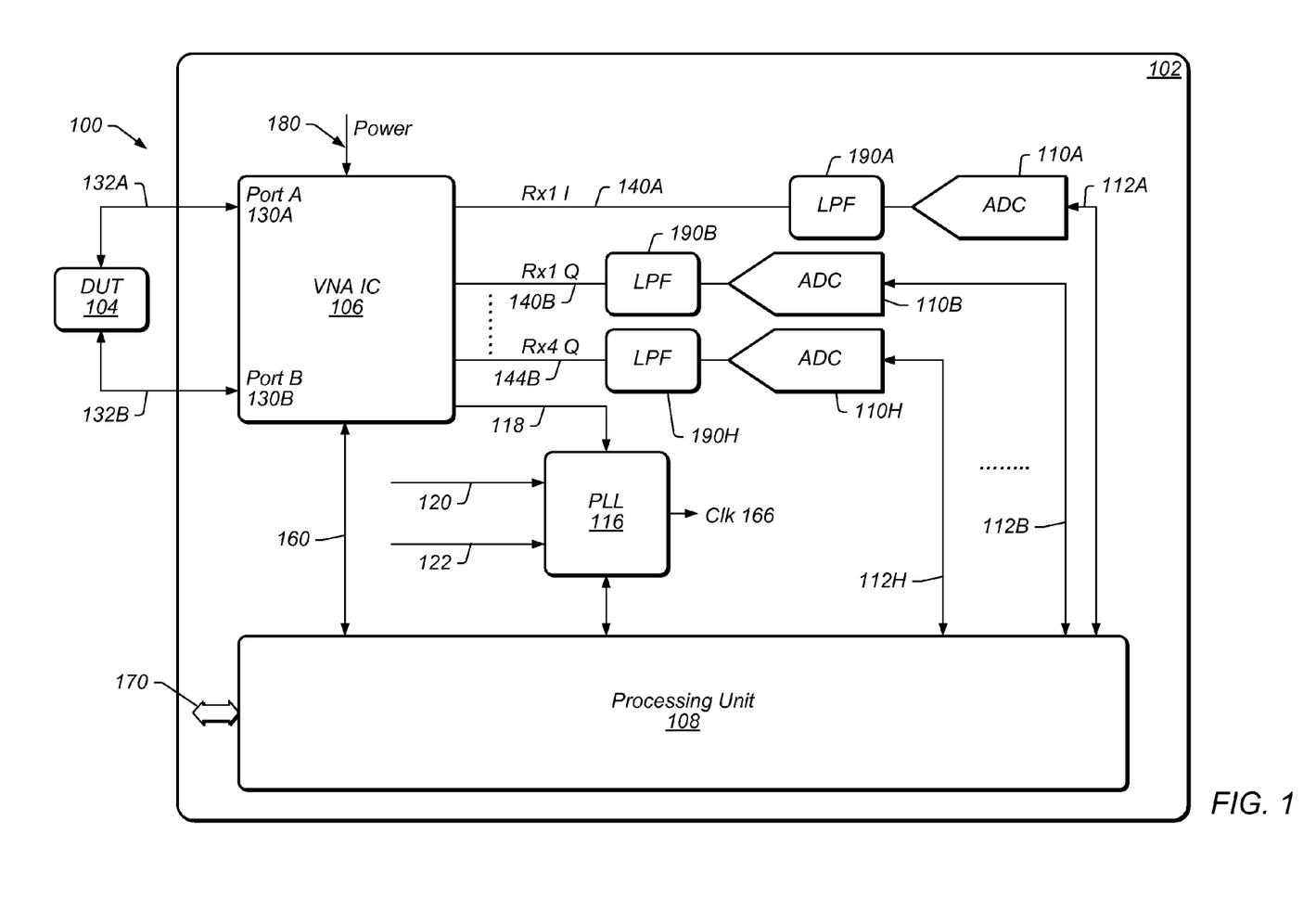
FIG. 1 is a block diagram of a VNA system, including the VNA IC, according to some embodiments.

FIG. 1—Block Diagram of a VNA System

FIG. 1 illustrates a general block diagram of a VNA system 100 that uses a VNA integrated circuit (IC), according to some embodiments. As used herein, the term "VNA IC" is intended to include any of various types of integrated circuits that are customized for a particular use. For example, the term "VNA IC" may include an application-specific integrated circuit (ASIC), including various types of ASICs such as a hybrid ASIC and/or an embedded array ASIC, an application specific standard product (ASSP), system-on-a-chip (SoC), programmable system on a chip (PSoC), and other integrated circuits customized by a user to contain the described VNA functionality. In some embodiments, more than one IC may be used to implement the described VNA functionality, i.e., a combination of two or more of any of the above described IC's may be used to implement the described VNA functionality. Additionally, in some embodiments, the one or more VNA IC's may contain additional elements and/or may contain fewer elements than described herein.

Thus FIG. 1 illustrates an exemplary VNA IC 106 that may be used in a dual-port VNA system 100, according to some embodiments. The VNA system 100 may be coupled to a device under test (DUT) 104 (such as a dual-port DUT) through at least two connections 132 A/B. Furthermore, the VNA IC 106 may be directly coupled to the DUT 104; alternatively there may be one or more components (not shown), such as electrostatic discharge (ESD) protection devices, pre-amplifiers, and/or attenuators, among others, between the connections of the VNA system 100 and the connections of the VNA IC 106.

The VNA IC 106 may thus couple to the DUT 104 through port A and port B. As explained below, the VNA IC 106 may generate a stimulus signal and apply it to the DUT 104 through either port A 130A or port B 130B. At the same time, the VNA IC 106 may read applied power to the DUT 104, reflected power back from the DUT 104, and transmitted power through the DUT 104 through ports A and B 130A/B respectively. In some embodiments, if port A 130A outputs the stimulus signal to the DUT 104, then port A 130A can measure applied and reflected power, and port B 130B can measure transmitted power; alternatively port B 130B can measure applied and reflected power, and port A 130A can measure transmitted power when port B 130 B outputs the stimulus signal to the DUT 104. The VNA system 100 may repeat the measurements using different signal frequency and/or intensity, in order to gather more parameters and their possible variations when using different frequencies and/or power levels of the stimulus signal.

In some embodiments, the VNA IC 106 may repeat the measurements until it can output four sets of orthogonal in-phase (I) outputs, e.g., signals 140A-144A, and quadrature (Q) outputs, e.g., signals 140B-144B. In some embodiments, the I and Q outputs 140A-144B are differential. In some embodiments, differential analog to digital converters (ADC's) 110A-110H may be used to read the I and Q outputs 140A-144B. In some embodiments, there may be eight differential ADC's (110A-110H) that are used to read four sets of differential I and Q data from the VNA IC 106. The four sets of orthogonal outputs I signals 140A-144A and Q signals 140B-144B may be low-pass filtered by one or more low-pass filters 190A-H and possibly amplified with one or more gain stages (not shown) prior to being propagated to the differential ADC's 110A-H. The one or more optional gain stages may be incorporated into the low pass filters 190A-H.

Thus the I and Q outputs 140A-144B generated by the VNA IC 106 may be analog, and thus may need to be digitized prior to processing by one or more of a processing unit and/or a computer. The one or more low pass filters 190A-H may be used to reject any out-of-band spurs and noise, which could alias and affect signal integrity (such as by increasing the signal to noise ratio) that may directly affect the quality of the measurement. The low-pass filters 190A-H may also use one or more gain stages (also external to the VNA IC) that could translate the VNA IC output signal levels and biasing to those of the ADCs 110A-H.

In some embodiments the ADC's 110A-H may have a 12 bit or higher resolution. In some embodiments the ADC's 110A-H may be able to sample at a rate of 2 mega samples per second or higher, but different resolutions and sampling rates are also contemplated. For example, lower effective sampling rates may be achieved by using programmable digital filtering inside the processing unit, i.e., in effect achieving better signal to noise ratios at the cost of slower measurement. In some embodiments, the ADC's 110A-H may be operable to use a single common differential DC reference voltage. In some embodiments, the ADC's 110A-H may use various other elements (not shown), such as a common low phase noise clock that controls the sampling of the ADC's 110A-H.

The four sets of analog orthogonal signals (140A-144B) may first be low-pass filtered by the low pass filters 190A-H before being processed by ADC's 110A-H in order to avoid any aliasing issues in the ADC's. In some embodiments, the ADC's 110A-H may digitize the analog signals from the I and Q outputs 140A-144B to create digitized I and Q data signals 112A-112H. In some embodiments, the digitized I and Q data signals 112A-H may be received by a processing unit 108 for initial processing. The term "processing unit" includes various processing entities such as an FPGA, microprocessor, microcontroller, system on a chip (SoC), and/or a programmable system on a chip (PSoC), among others.

In some embodiments, the processing unit 108 may receive digitized I and Q data signals 112A-112H and may perform initial processing. In some embodiments, the processing unit may send the processed data to a monitor for display via data lines 170, or it may send the data to one or more storage devices (not shown). In some embodiments, the processing unit 108 may send the processed data to a host computer (not shown) for display via control and data lines 170. The processing unit 108 may also communicate with memory, such as RAM, EEPROM, flash, among others, to store and/or retrieve any calibration constants to correct for any VNA system 100 errors.

The processing unit 108 may also control one or more of the ADC's 110A-H, the Frequency Detector/PLL 116, and the VNA IC 106. For example, the processing unit 108 may instruct the ADC's 110A-H when to start sampling and whether to apply any internal calibration constants when acquiring data from the VNA IC 106. The PLL 116 may be operable to calibrate frequency. For example, in some embodiments, a system clock may be used to calibrate any VNA IC internal voltage controlled oscillators (VCO, such as the tone generator 502 of FIG. 5) with the use of the PLL 116. In some embodiments, a system clock of 100 MHz may be used, but other rates are also contemplated. However, since the VNA IC 106 may not use intermediate frequency (IF), it may not need any other separate PLL's, such as may be needed for other VNA designs.

Figure 5:
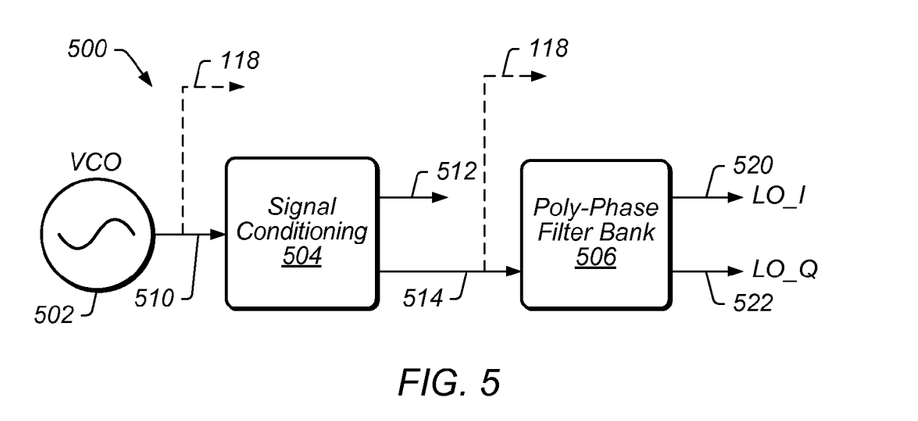
FIG. 5 is a block diagram of an exemplary clock generator, according to some embodiments.

Specifically, in some embodiments, the tone generator 502 (e.g., a VCO) may have a high frequency tolerance due to component tolerances. To obtain higher frequency accuracy, each of the settings of the tone generator 502, such as the addition or removal of a binary weighted capacitor from the VCO tank or switching to a different VCO body, may be characterized. The clock output 118 of the VNA IC may be compared to a reference clock whose frequency accuracy is well known, e.g., either a 100 MHz system clock 120 or an external clock reference 122. In some embodiments, the comparison of frequency may be done by the PLL 116.

In some embodiments, the processing unit 108 may configure the tone generator 502 of the VNA IC to output a desired frequency. Due to the tolerances mentioned above, this frequency may be only approximately met. The processing unit may also configure the PLL 116 to expect a set frequency coming out of the VNA IC (e.g., via signal 118). Depending on the difference between the set frequency and the actual frequency generated by a clock generator 500 (see FIG. 5), the PLL 116 may determine and inform the processing unit 108 of any discrepancy. The processing unit 108 may then attempt to change and optimize (e.g., send control signals and/or configure some register(s)) component parameter(s) inside the tone generator 502, such as changing a voltage applied across a varactor (not shown) to minimize any difference between the set frequency and the actually generated frequency. This calibration procedure may be repeated until the error is smaller than some specified value. As mentioned above, the PLL 108 may use a reference clock whose accuracy is well known (e.g., the system clock 120 and/or the external clock reference 122) for the frequency comparison. The processing unit may store the VCO settings that resulted in optimum frequency accuracy in a memory device to later retrieval of the VCO settings and subsequent use during measurements.

Furthermore, during frequency calibration, the processing unit 108 may instruct the PLL 116 which frequency rates to compare—either of its two reference clock inputs with a clock output 118 of the VNA IC 106. The processing unit 108 may also instruct the PLL 116 to use one or more calibration constants to correct any errors (and/or to compensate for some discrepancy such as drift) inside the PLL itself 116. The processing unit 108 may also program the VNA IC 106 with one or more settings, such as an amount of gain needed at a particular receiver, a frequency to be generated, which port is an input or an output, among others.

Figure 2:
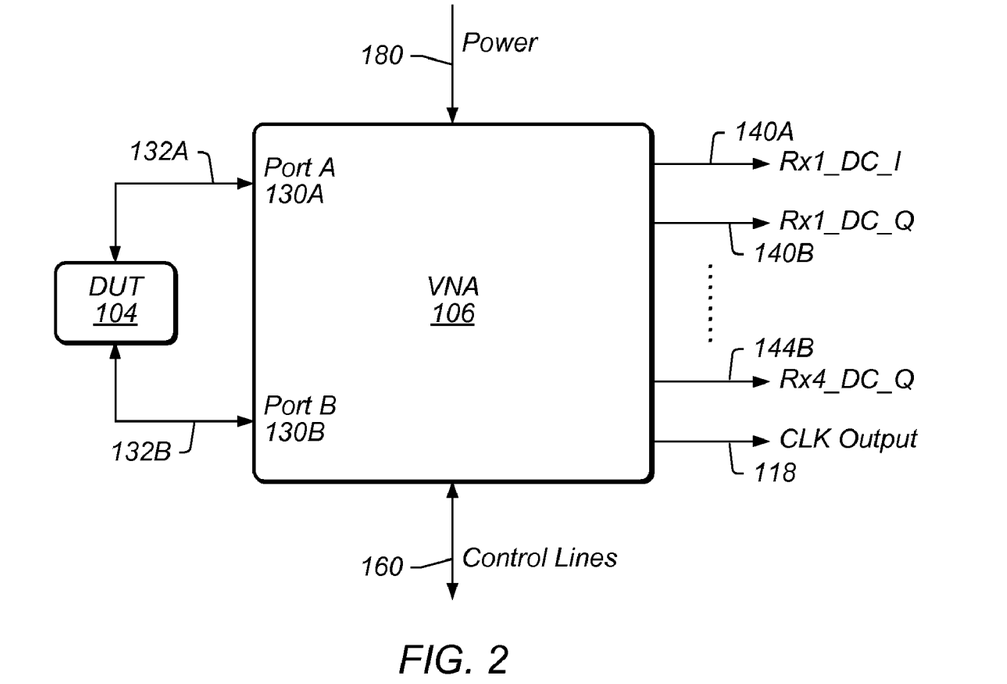
FIG. 2 is a block diagram of an exemplary VNA IC, according to some embodiments.

FIG. 2—Block Diagram of a VNA IC

FIG. 2 illustrates a general block diagram of a VNA integrated circuit (IC), according to some embodiments. In some embodiments, the VNA IC 106 is a dual-port device, although devices with more ports are contemplated. In some embodiments, the VNA IC 106 may operate in a fully differential mode, but can also operate in a single-ended mode if it is properly terminated. The VNA IC 106 may be connected to the DUT 104 to find the DUT's S-parameters. The VNA IC 106 may get its power (e.g., DC power) via power connections 180. The VNA IC 106 may also contain implicit ground connections for power return and signal grounding (not shown). The VNA IC 106 may be controlled and/or programmed by control lines 160 by the processing unit 108 (see FIG. 1).

Thus the VNA IC 106 may comprise two or more ports, such as port A 130A and port B 130B. The VNA IC 106 may be coupled to the DUT 104 using the two ports 130A-B. The VNA IC may generate a stimulus signal (e.g., a sine wave) and transmit the stimulus to the DUT. Each of the two (or more) ports 130A-B may include at least two receivers. In the first port (e.g., output port A 130A), the receivers may measure the output power as a reference and measure the reflected power from the DUT 104. One of the receivers in the other port (e.g., input port B 130B) may measure the transmitted power through the DUT 104. In some embodiments, the stimulus signal may be used as a local clock for all the receivers, which may result in the outputs having a frequency of 0 Hz (or DC). The outputs, after being digitized and/or calibrated, may represent S-parameters of the DUT 104. The processing unit (element 108 of FIG. 1) may change the frequency and/or amplitude by communicating with the VNA IC 106 through its control lines 160.

In some embodiments, ports A and B 130A-B of the VNA IC 106 may be radio frequency (RF) measurement ports that connect via leads 132 A/B to the DUT 104. In some embodiments, each of the ports A and B 130A/B may have two receivers (e.g., port A may have a first and a second receiver and port B may have a third and a fourth receiver). If port A 130A is used as an output port, the first receiver may be used as a reference to measure the output power and the second receiver may read the reflected power from the DUT. In this case, port B may be used as an input port where the fourth receiver may measure the transmitted power through the DUT. After digitization and processing, this measurement may result in two of the total four S-parameters of the dual-port DUT (these two S parameters being $S_{11}$ and $S_{21}$). Ports A and B may exchange their roles to generate the remaining S-parameters of the dual-port DUT (where these two remaining S parameters may be $S_{22}$ and $S_{12}$).

In some embodiments, direct-conversion may be used by the receivers (see below). Thus the output of the receivers may be at a DC level, and two orthogonal measurements may be used to represent gain and phase information. The two orthogonal measurements may include an I (in-phase component) and Q (quadrature-phase component) signals. For instance, with reference to exemplary FIG. 2, signal named "Rx1DC_I" 140A may be the I-channel DC output of the first receiver. As mentioned above, the output signals 140A-144B may be differential signals comprising two connections for each of the signals 140A/B (e.g., Rx1_DC_I+ and Rx1_DC_I−), which may be received by a differential-input analog-to-digital converter (ADC), such as one or more of the ADC's 110A-110H of FIG. 1. As mentioned above, the output of the ADC may be transmitted to the processing unit for further analysis. In some embodiments, the VNA IC 106 may have four receivers, thus there may be eight differential DC outputs 140A-144B coming out from the VNA IC 106, which may use eight differential-input ADC's.

In some embodiments, the VNA IC 106 may also output a clock signal 118 (e.g., a sine wave). The clock signal may be provided as an output so that other devices of the VNA system 100 may perform frequency calibration or multiple device synchronization (i.e., may be used by the processing unit and/or the PLL as shown in FIG. 1).

Figure 3:
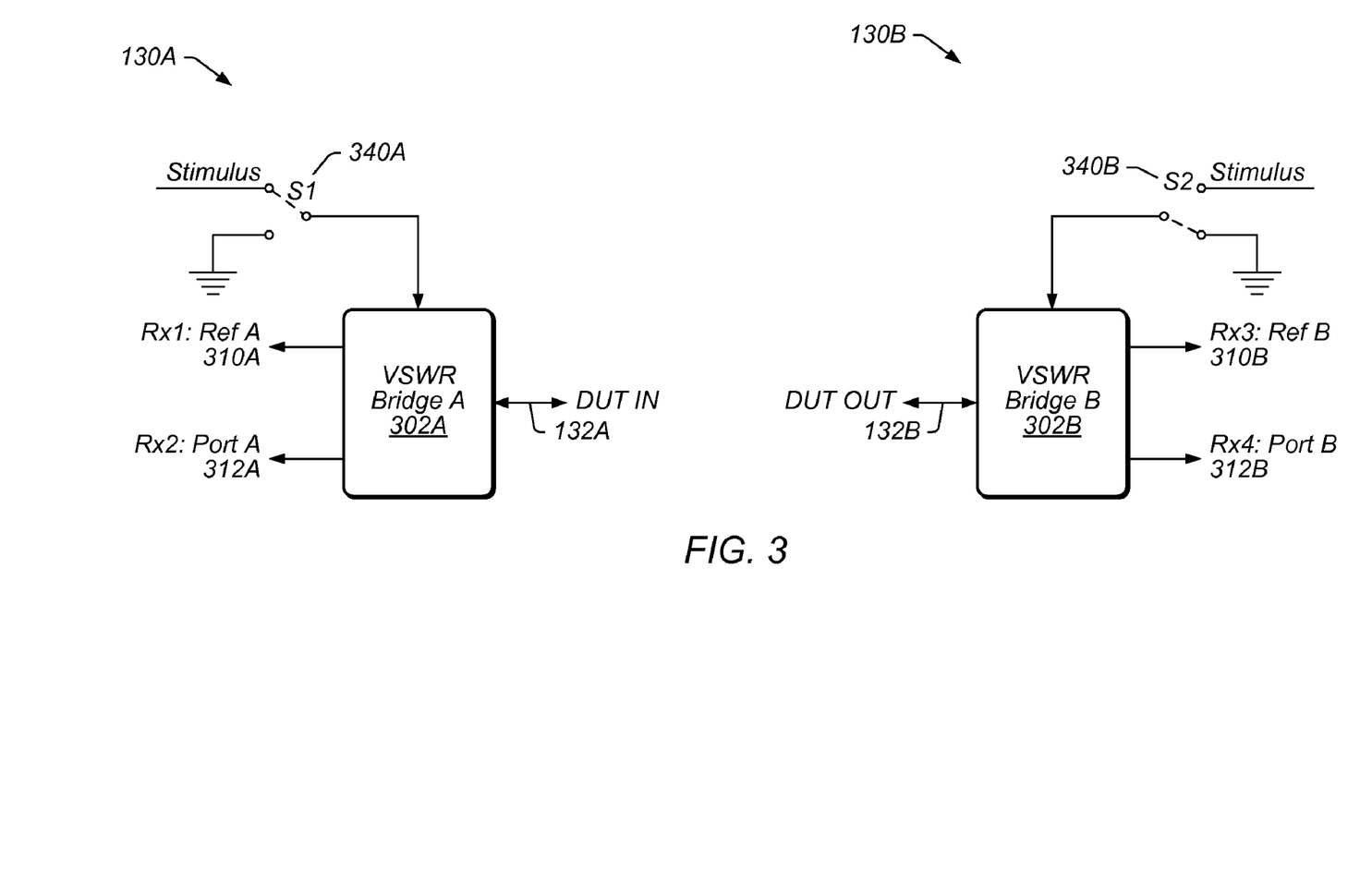
FIG. 3 is a block diagram of exemplary ports of the VNA IC, according to some embodiments.

FIG. 3—Block Diagram of Ports A and B of the VNA IC

FIG. 3 is a block diagram of ports A and B of an exemplary VNA IC, according to some embodiments.

In some embodiments, port A 130A of the VNA IC 106 may comprise a first switch S1 340A, a first voltage standing wave ratio (VSWR) bridge 302A, and receivers 310A and 312A, such as a first receiver 310A and a second receiver 312A. Similarly, in some embodiments, port B 130B of the VNA IC may comprise a second switch S2 340B, a second VSWR bridge 302B, and receivers 310B and 312B, such as a third receiver 310B and a fourth receiver 312B. The VNA may contain one or more switches (e.g., switch S1 340A and switch S2 340B) that may control which of the two ports acts as the output and which port acts as the input.

In some embodiments, if port A 130A is selected as an input, then port B 130B may be the output. In some embodiments, each port may have two receivers. In some embodiments one or more of the ports has only one receiver. In some embodiments, each port may have a different number of receivers, e.g., port A may have 1 receiver and port B may have 3 receivers, or both ports may have 3 receivers each. In some embodiments, switches S1 and S2 340A-B may be the same switch. In some embodiments, switches S1 and S2 340A-B may be two separate switches controlled by a single control signal and/or a hardware register. In some embodiments, other implementations of switching functionality between the ports are contemplated.

For example, Port A may have two receivers: "Rx1" and "Rx2" (e.g., see FIGS. 1 and 2). In some embodiments, a first receiver may provide a reference measurement when Port A is set as the output port (and port B is the input port). In some embodiments, under the same conditions, the second receiver 312A of the first port (e.g., port A 130A) may read (via 132A) a reflected power measurement from the DUT. It is noted that the first and second receivers are naming conventions only.

Furthermore, one of the receivers on the second port (e.g., port B 130B) may measure (e.g., via 132B) transmitted power through the DUT.

In some embodiments, after the first port 130A makes its measurements, the functionality of the two ports may switch. Thus the first measurement port 130A (i.e., first port or port A) may be used as an input port and the second measurement port 130B (i.e., second port or port B) may be used as the output port. The second receiver 312A may measure the (reverse) transmitted power through the DUT when Port A is the input and Port B is set as the output.

Figure 4:
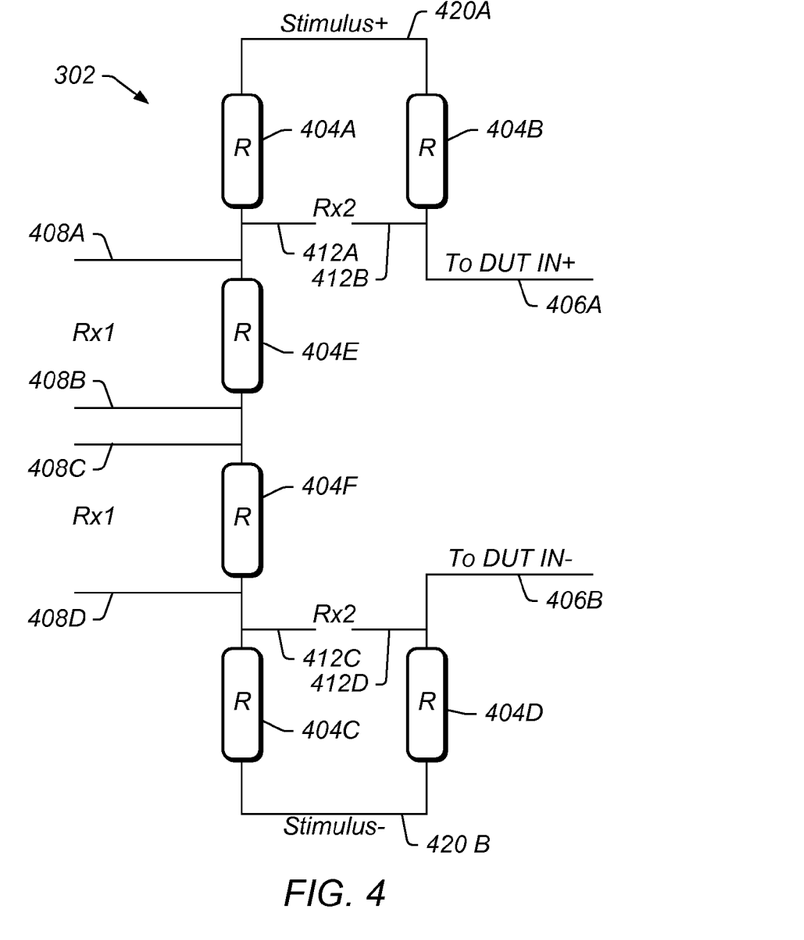
FIG. 4 is a block diagram of an exemplary VSWR bridge, according to some embodiments.

FIG. 4—Exemplary VSWR Bridge

FIG. 4 is a block diagram of an exemplary voltage standing wave ratio (VSWR) bridge according to some embodiments.

In some embodiments, each VSWR bridge 302 may act as a directional device that allows distinct measurements between applied and reflected powers. In other words, in some instances the same port may both provide a stimulus signal to the DUT and measure reflected power back from the DUT. In order to somehow differentiate between the measurement of the applied and reflected powers, a directional device may be used, such as a VSWR bridge 302. Thus the use of a directional device, such as a VSWR bridge 302, may allow the VNA to measure both the applied and reflected powers using the same port, but using separate receivers. In some embodiments other directional devices are contemplated.

Thus in FIG. 4, an exemplary VSWR bridge 302 may allow measurements of both applied and reflected powers from the DUT. The applied power measurement may be used as a reference measurement, i.e., measure the actual stimulus signal being applied to the DUT. In some embodiments, each receiver may use differential signals to connect to the VSWR bridge 302. For example, the first receiver may connect to the VSWR bridge using connections 408A-D, and the second receiver may connect to the VSWR bridge 302 using connections 412A-D. In some embodiments, the reflected or transmitted power (depending on the configuration of the port containing the receiver that contains/uses the VSWR bridge, i.e., output or input respectively) may be measured using the 412A-D connections. In some embodiments, the reference measurement may be taken using the 408A-D leads (such as when using the port that contains the receiver as the output port).

In some embodiments, the VSWR bridge 302 may couple to the DUT using connections 406A-B, which correspond to the leads 132A-B of FIGS. 1-3 (such as 406A and 406B corresponding to differential connections 132A for port A, with similar differential connections 132B for port B). In some embodiments, the connections 406A-B to the DUT are also differential connections. In some embodiments, some or all of the listed connections are single-ended connections.

In some embodiments, the VSWR bridge 302 may comprise multiple resistors 404A-F. In some embodiments, each of the resistors 404A-F are substantially similar. In some embodiments, each of the resistors 404A-F are precision resistors. It is noted that the number and placement of resistors 404A-F is exemplary only, and solutions with a different number and/or placement of resistors are contemplated. The resistors 404A-F may be "on-chip" resistors, i.e., may be a part of the VNA IC; however, in some embodiments one or more of the resistors 404A-F may be external resistors to the VNA IC.

FIG. 5—Exemplary Clock Generator

FIG. 5 is a block diagram of an exemplary clock generator, according to some embodiments.

In some embodiments, the VNA IC may include a single clock generation unit 500. In some embodiments, the clock generation unit 500 may comprise one or more of a tone generator 502, a signal conditioning unit 504, and/or a poly-phase filter bank 506 (e.g., that may act as a quadrature generator). The tone generator 502 may be operable to output a single clock signal 510, such as a sinusoidal wave with a first frequency. It is understood that the frequency of the tone generator 502 may be tunable. Thus the VNA IC may be able to repeat the measurements described herein using different frequencies. In some embodiments, a system clock (e.g., inputs 120/122) may be used to calibrate the tone generator 502, such as a voltage controlled oscillators (VCO). The tone generator 502 may be controller by a user and/or an application, meaning that the user and/or the application may control one or more frequencies at which the VNA IC takes its measurements.

In some embodiments, the tone generator 502 may output two or more clock signals (or a copy of the single clock signal 510). In other words, the single clock generation unit 500 may also output a copy 118 of the single clock signal (or the single clock signal may be split-up/buffered into the copy of the single clock signal). The tone generator 502 may be a voltage controlled oscillator operable to generate a single clock signal 510 having a wide range of frequencies. The tone generator 502 may be controlled by a variety of devices, such as by setting one or more registers to switch in binary weighted capacitors (not shown), and/or by powering up different sections of the tone generator 502 (where each section may cover some portion of a frequency range), among others. In some embodiments, a varactor diode (not shown) may be connected in parallel with the binary weighted capacitors to facilitate fine tuning of frequency of the VCO. Capacitance of the varactor diode may be controlled by a digital-to-analog converter DAC (not shown). This DAC may be controlled by a register that may be set (e.g., by some logic and/or a user).

The signal conditioning unit 504 may perform signal conditioning on the single clock signal 510 and generate several signals, including a stimulus signal 512 and/or a fixed amplitude copy of the stimulus signal 514, among others. Thus the signal conditioning unit 504 may perform amplification and/or attenuation adjustment on the single clock signal 510. The stimulus signal 512 may be applied to the DUT; alternatively the stimulus signal 512 may be further filtered and/or amplified/attenuated before applying to the DUT. As mentioned above, the stimulus signal 512 may be applied to one of the ports.

In some embodiments, the signal conditioning unit may perform some gain adjustments on the received single clock signal 510 prior to generating the stimulus signal 512 and/or the filtered clock signal 514, among others. In some embodiments, the signal conditioning unit may generate a clock signal 118 that may be propagated to the PLL 116 of FIG. 1. Alternatively the clock signal 118 can be generated by the tone generator 502 directly.

The poly-phase filter bank 506 may receive the fixed amplitude copy of the stimulus signal 514 and generate orthogonal in-phase (I) 520 and quadrature (Q) 522 clock signals. The poly-phase filter bank 506 may comprise multiple stages and/or a bank of multi-stage poly-phase filters to cover a wide range of frequency and achieve a desired accuracy. Additional gain units internal to the poly-phase filter bank block may be used, such as to make up any loss in signal level due to passing of the clock signal(s) through the multiple stages of the poly-phase filter bank 506.

Use of direct conversion has numerous advantages to the VNA IC, such as it enables the VNA IC to use only one clock generator as opposed to multiple clock generators (such as used by traditional VNA's). Furthermore, the use of the single clock generation unit 500 may limit the number and use of PLLs. For example, in some embodiments only one PLL (e.g., PLL 110 of Figure may be needed as opposed to multiple PLL's, which may limit the space and power requirements of the VNA IC.

Figure 6:
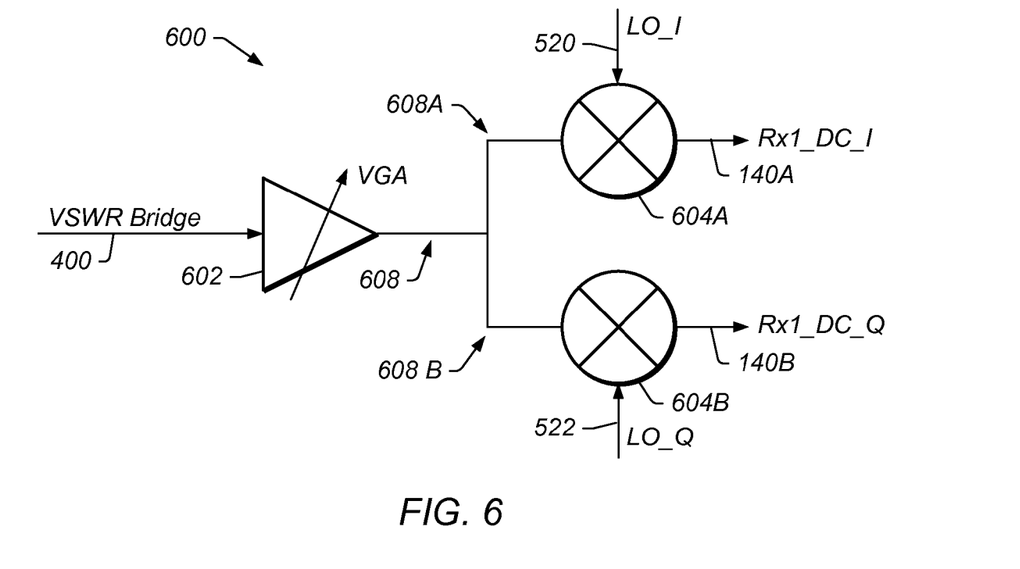
FIG. 6 is a block diagram of an exemplary receiver, according to some embodiments.

FIG. 6—Exemplary Receiver

FIG. 6 is a block diagram of an exemplary receiver, according to some embodiments.

In some embodiments, the dual-port VNA IC may comprise four or more receivers, but VNA ICs that use fewer receivers are also contemplated. For example, in some embodiments, one or more of the ports in the VNA IC may not use a second receiver to measure its reference voltage (e.g., the actual output stimulus signal), and may use a different method to measure and/or use the value of the stimulus signal, and/or may operate in single-ended fashion.

FIG. 6 shows an exemplary receiver 600 comprised in the VNA IC. In some embodiments, the receiver 600 may receive an input 400 (also referred to as intermediate measurement signal(s)) from a VSWR bridge, such as indicated in FIG. 4 (e.g., using leads 408A-D or 412A-D). In some embodiments, the receiver may have an amplifier 602, such as a multi-stage variable gain amplifier (VGA). In some embodiments, other types of the amplifier 602 are contemplated. In some embodiments, two or more amplifiers may be used instead. The amplifier 602 may propagate two signals 608 A-B to two mixers 604A and 604B. In some embodiments, the amplifier 602 may generate/propagate one amplified signal 608 which then may be split.

Each of the mixers 604 A/B may receive a clock signal 520/522 from the clock generator. For example, a first mixer 604A may receive the I clock signal 520 as well as the input 400 from a VSWR bridge. The first mixer 604A may then mix these two signals (i.e., the I clock signal 520 and the input 400) together to generate a first in-phase (I) signal 140A. Similarly, a second mixer 604B may receive the Q clock signal 522 as well as the input 400 from a VSWR bridge. The second mixer 604B may then mix these two signals (i.e., the Q clock signal 522 and the input 400) together to generate a first quadrature (Q) signal 140B.

As mentioned above, the VNA IC 106 may comprise four or more receivers, such as receiver 600, and repeat the above calculations until it can output four sets of orthogonal signal outputs, i.e., I signals 140A-144A and Q signals 140B-144B. As mentioned above with reference to FIG. 1, the four sets of orthogonal signals may first be low-pass filtered before being processed by ADC's and then propagated to a processing unit for analysis.

Figure 7:
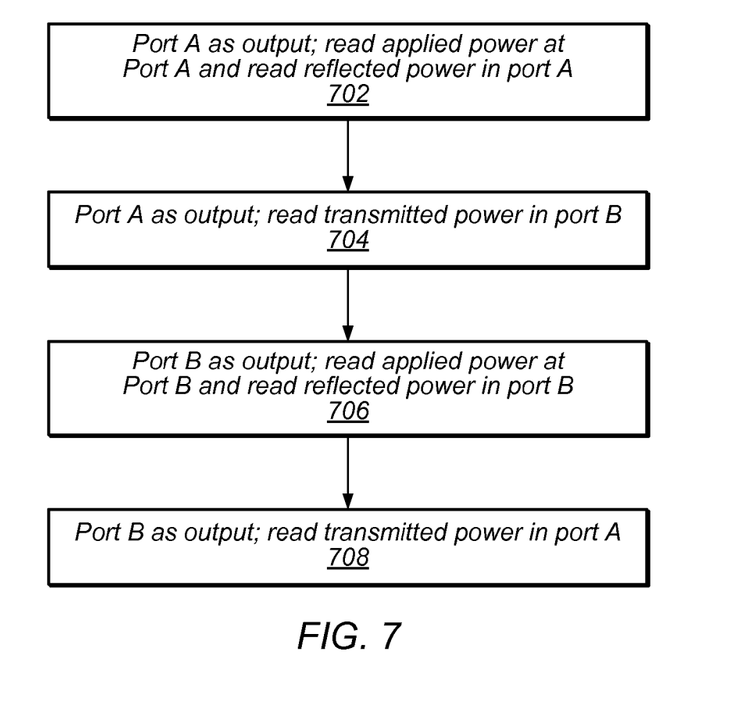
FIG. 7 is a flowchart of an exemplary operation of the VNA, according to some embodiments.

FIG. 7—Flowchart of VNA Operation

FIG. 7 is an exemplary flowchart of operation of the VNA. The method shown in FIG. 7 may be used in conjunction with the VNA IC shown in the above Figures, among other devices. In various embodiments, some of the method elements shown may be performed concurrently, in a different order than shown, or may be omitted. Additional method elements may also be performed as desired.

In 702, a first measurement may be taken. For example, in the exemplary VNA of FIG. 1, port A may be set as an output and port B may be set as an input. The DUT may be coupled to the VNA as shown in FIG. 1. Port A may propagate a stimulus signal to the DUT, and it may measure reflected power using one of its receivers. Port A may also use another receiver to measure the actual signal being applied to the DUT (e.g., take an applied power measurement for reference). The resulting measurement may be the S-parameter $S_{11}$ of the DUT. Port B may be idle in this part of the measurement.

In 704, a second measurement may be taken. For example, in the exemplary VNA of FIG. 1, port A may still be an output and port B may still be an input. The DUT may be coupled to the VNA as shown in FIG. 1. Port A may propagate a stimulus signal to the DUT, and it may use a receiver to measure the actual signal being applied to the DUT (e.g., take a reference measurement). Port B may measure the transmitted, or pass-through, power using one of its receivers. The resulting measurement may be the S-parameter $S_{21}$ of the DUT. In some embodiments, measurements 702 and 704 may be performed simultaneously. In some embodiments, the measurements 702 and 704 may be performed in reverse order.

In 706, a third measurement may be taken. For example, in the exemplary VNA of FIG. 1, port B may be set as an output and port A may be set as an input. The DUT may be coupled to the VNA as shown in FIG. 1. Port B may propagate a stimulus signal to the DUT, and it may measure reflected power using one of its receivers. Port B may also use another receiver to measure the actual signal being applied to the DUT (e.g., take an applied power measurement as a reference). The resulting measurement may be the S-parameter $S_{22}$ of the DUT. Port A may be idle in this part of the measurement.

In 708, a fourth measurement may be taken. For example, in the exemplary VNA of FIG. 1, port B may still be an output and port A may still be an input. The DUT may be coupled to the VNA as shown in FIG. 1. Port B may propagate a stimulus signal to the DUT, and it may use a receiver to measure the actual signal being applied to the DUT (e.g., take a reference measurement). Port A may measure the reverse transmitted, or reverse pass-through, power using one of its receivers. The resulting measurement may be the S-parameter $S_{12}$ of the DUT. In some embodiments, measurements 706 and 708 may be performed simultaneously. In some embodiments, the measurements 706 and 708 may be performed in reverse order. Furthermore, in some embodiments, all the above measurements 702-708 may occur in different order than described.

Although the embodiments above have been described in considerable detail, numerous variations and modifications will become apparent to those skilled in the art once the above disclosure is fully appreciated. For example, most of the discussion up to this point assumed a dual-port DUT. However, a single-port DUT may be connected to either of the VNA ports to have reflection measurements performed on it. Thus it is intended that the following claims be interpreted to embrace all such variations and modifications.

I claim:

1. A vector network analyzer (VNA) integrated circuit (IC) comprising:
   a clock generator configured on the VNA IC to generate a stimulus signal, an in-phase (I) clock signal, and an quadrature-phase (Q) clock signal;
   a plurality of receivers configured on the VNA IC, wherein each receiver is coupled to the clock generator and receives the I clock signal and the Q clock signal from the clock generator;
   a first measurement port configured on the VNA IC, and comprising first and second receivers and a first voltage standing wave ratio (VSWR) bridge, wherein the first port is configured to couple to a device under test (DUT), wherein the first port is configurable as an input or an output, wherein the first measurement port is configured to receive the stimulus signal from the clock generator, wherein the first VSWR bridge is configured to provide the stimulus signal to the DUT when the first measurement port is configured as the output; and a second measurement port configured on the VNA IC, and comprising third and fourth receivers and a second VSWR bridge, wherein the second measurement port is configured to couple to the DUT, wherein the second measurement port is configurable as an input or an output, wherein the second measurement port is configured to measure transmitted power through the DUT using the second VSWR bridge when the second measurement port is configured as the input;

wherein the first and second receivers are configured to respectively receive the applied and reflected power measurements from the first VSWR bridge, and operate on the received applied and reflected power measurements by performing direct conversion using the I and Q clock signals to generate first and second I outputs and first and second Q outputs.

2. The VNA IC of claim 1,
wherein the third receiver is idle; and
wherein the fourth receiver is configured to measure the transmitted power through the DUT.

3. The VNA IC of claim 1,
wherein the first measurement port is configured to operate as the output while the second measurement port operates as the input during a first measurement, wherein the first measurement port is configured to operate as the input while the second measurement port operates as the output during a second measurement, wherein each of the first and second measurements comprise one or more physical measurements;
wherein the first and the second measurements comprise a VNA measurement, wherein the VNA measurement comprises measurements of four S-parameters of the DUT.

4. The VNA IC of claim 3,
wherein during the second measurement the third and the fourth receivers of the second measurement port operate substantially similar to how the first and second receivers of the first measurement port operate, respectively, during the first measurement; and
wherein during the second measurement the first and the second receivers of the first measurement port operate substantially similar to how the third and fourth receivers of the second measurement port operate, respectively, during the first measurement, including performing direct conversion using the I and Q clock signals to generate third and fourth I outputs and third and fourth Q outputs respectively.

5. The VNA IC of claim 4,
wherein in performing direct conversion, the first receiver is configured to mix the applied power measurement with the I and Q clock signals to generate the first I and the first Q outputs respectively; and
wherein in performing direct conversion, the second receiver is configured to mix the reflected power measurement with the I and Q clock signals to generate the second I and the second Q outputs respectively.

6. The VNA IC of claim 1, wherein the clock generator further comprises:
a tone generator configured to generate a single clock signal with a tunable frequency range;
a signal conditioning unit coupled to the signal generator and configured to receive the single clock signal and generate a filtered single clock signal and the stimulus signal; and a polyphase filter coupled to the tone generator and configured to receive the filtered single clock signal, wherein the polyphase filter is configured to generate the I clock signal and the Q clock signal based on the filtered single clock signal.

7. The VNA IC of claim 6,
wherein in generating the stimulus signal, the signal conditioning unit is configured to generate the stimulus signal based on the filtered single clock signal.

8. The VNA IC of claim 1,
wherein the first and the second I outputs and the first and second Q outputs are configured to be transmitted to a processing unit for analysis.

9. The VNA IC of claim 1,
wherein in performing direct conversion, the third receiver is configured to mix the applied power measurement with the I and Q clock signals to generate the first I and the first Q outputs, respectively; and
wherein in performing direct conversion, the fourth receiver is configured to mix the reflected power measurement with the I and Q clock signals to generate the second I and the second Q outputs, respectively.

10. The VNA IC of claim 1,
wherein the first measurement port is configured to measure the reverse transmitted power through the DUT.

11. A vector network analyzer (VNA) integrated circuit (IC) comprising:
two measurement ports configured on the VNA IC to couple to a clock generator, wherein the two measurement ports are further configured to couple to a device under test (DUT), wherein each of the two measurement ports is configurable to operate as either an input or an output, wherein when a first measurement port of the two measurement ports is configured as an input, a second measurement port of the two measurement ports is configured as an output, and wherein each of the two measurement ports comprises:
a voltage standing wave ratio (VSWR) bridge, wherein the VSWR bridge of the second measurement port is configured to receive a stimulus signal generated by the VNA, and propagate the stimulus signal to the DUT, wherein the VSWR bridge of the first measurement port is configured to:
receive a first measurement signal and a second measurement signal both output by the DUT in response to the propagated stimulus signal; and
output a corresponding first intermediate signal and second intermediate signal; and
two receivers coupled to the VSWR bridge and to the clock generator, wherein each of the two receivers is configured to receive an I clock signal and a Q clock signal generated by the VNA,
wherein a first of the two receivers is configured to receive the first intermediate signal and generate a first I signal by mixing the first intermediate signal with the I clock signal, wherein the first of the two receivers is further configured to receive the first intermediate signal and generate a first Q signal by mixing the first intermediate signal with the Q clock signal; and
wherein a second of the two receivers is configured to receive the second intermediate signal and generate a second I signal by mixing the second intermediate signal with the I clock signal, wherein the second of the two receivers is further configured to receive the second intermediate signal and generate a second Q signal by mixing the second intermediate signal with the Q clock signal.

12. The VNA IC of claim 11, further comprising:
the clock generator configured on the VNA IC to generate the stimulus signal, the clock generator comprising:
a tone generator configured to generate a first clock signal; and
a poly-phase filter coupled to the tone generator and configured to receive the first clock signal, wherein the poly-phase filter is configured to generate an in-phase (I) clock signal and a quadrature (Q) clock signal based on the first clock signal.

13. The VNA IC of claim 12,
wherein the clock generator further comprises:
a signal conditioning unit configured to receive the first clock signal and generate a filtered first clock signal and the stimulus signal;
wherein the poly-phase filter is configured to receive the filtered first clock signal and generate the I clock signal and the Q clock signal based on the filtered first clock signal.

14. The VNA IC of claim 13,
wherein in generating the stimulus signal, the signal conditioning unit is configured to perform one or more of amplification and attenuation adjustment on the filtered first clock signal.

15. A vector network analyzer (VNA) integrated circuit (IC) comprising:
two ports both configured on the VNA IC to couple to a device under test (DUT), wherein each of the two ports is configurable to operate either as an input or an output, wherein when a first port of the two ports is configured to operate as an input, a second port of the two ports is configured to operate as an output, wherein each of the two ports comprises:
a voltage standing wave ratio (VSWR) bridge, wherein the VSWR bridge of the first port is configured to receive a first measurement signal and a second measurement signal from the DUT, and output an intermediate first signal and an intermediate second signa, respectively, wherein the VSWR bridge of the second port is configured to receive a stimulus signal generated by the VNA, and propagate the stimulus signal to the DUT; and
two receivers coupled to the VSWR bridge, wherein each of the two receivers is configured to receive an in-phase (I) clock signal and a quadrature (Q) clock signal;
wherein a first of the two receivers is configured to:
receive the first intermediate signal and the I and Q clock signals; and
perform a first direct conversion using the first intermediate signal and the I and Q clock signals; and
wherein a second of the two receivers is configured to:
receive the second intermediate signal and the I and Q clock signals; and
perform a second direct conversion using the second intermediate signal and the I and Q clock signals.

16. The VNA IC of claim 15,
wherein in performing the first direct conversion, the first of the two receivers is configured to:
generate a first I signal by mixing the first intermediate signal with the I clock signal;
generate a first Q signal by mixing the first intermediate signal with the Q clock signal;
wherein in performing the second direct conversion, the second of the two receivers is configured to:
generate a second I signal by mixing the second intermediate signal with the I clock signal; and
generate a second Q signal by mixing the second intermediate signal with the Q clock signal.

17. The VNA IC of claim 15, further comprising:
a clock generator configured on the VNA IC to generate the stimulus signal from a clock signal, wherein the clock generator is further configured to generate the I clock signal and the Q clock signal from the clock signal;
wherein the clock generator is coupled to each of the two ports.

* * * * *

UNITED STATES PATENT AND TRADEMARK OFFICE
CERTIFICATE OF CORRECTION

PATENT NO. : 8,378,693 B2
APPLICATION NO. : 12/258761
DATED : February 19, 2013
INVENTOR(S) : Michel M. Azarian It is certified that error appears in the above-identified patent and that said Letters Patent is hereby corrected as shown below:

Column 11, line 38, after measurement insert --,--.
Column 11, line 43, after measurement insert --,--.
Column 14, line 1, delete "signa" and insert --signal--.

Signed and Sealed this
Ninth Day of April, 2013

Teresa Stanek Rea
*Acting Director of the United States Patent and Trademark Office*